US012618136B2

(12) United States Patent
Kersschot et al.

(10) Patent No.: US 12,618,136 B2
(45) Date of Patent: May 5, 2026

(54) CAPACITIVE SENSOR FOR POSITIONING IN OVJP PRINTING

(71) Applicant: Universal Display Corporation, Ewing, NJ (US)

(72) Inventors: Bruno Kersschot, Antwerp (BE); Ronald Stevens, Eindhoven (NL); Eric Kosters, Eindhoven (NL); Ron Asjes, Valkenswaard (NL); William E. Quinn, Whitehouse Station, NJ (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 421 days.

(21) Appl. No.: 15/968,166

(22) Filed: May 1, 2018

(65) Prior Publication Data

US 2018/0323373 A1     Nov. 8, 2018

Related U.S. Application Data

(60) Provisional application No. 62/501,912, filed on May 5, 2017.

(51) Int. Cl.
| | |
|---|---|
| *C23C 14/12* | (2006.01) |
| *C23C 14/04* | (2006.01) |
| *C23C 14/24* | (2006.01) |

(52) U.S. Cl.
CPC .............. *C23C 14/04* (2013.01); *C23C 14/12* (2013.01); *C23C 14/24* (2013.01)

(58) Field of Classification Search
None
See application file for complete search history.

(56) References Cited

U.S. PATENT DOCUMENTS

| | | | |
|---|---|---|---|
| 4,654,581 A | 3/1987 | Neukermans |
| 4,769,292 A | 9/1988 | Tang |
| | (Continued) | |

FOREIGN PATENT DOCUMENTS

| | | |
|---|---|---|
| CN | 1294028 C | 1/2007 |
| CN | 101434145 A | 5/2009 |
| | (Continued) | |

OTHER PUBLICATIONS

Baldo, "Highly efficient phosphorescent emission from organic electroluminescent devices," Nature, vol. 395, pp. 151-154, 1998.
(Continued)

*Primary Examiner* — Jeffrie R Lund
*Assistant Examiner* — Tiffany Z Nuckols
(74) *Attorney, Agent, or Firm* — Butzel Long

(57) ABSTRACT

Devices and techniques that include use of a capacitive sensor to permit an OVJP print head to orient itself relative to conductive or dielectric traces on a printing substrate are disclosed. Such a sensor enables real-time measurement and closed-loop control of print head position with respect to substrate traces. This enables, for example, micron scale resolution in a dimension transverse to printing while permitting both the substrate and movement of the OVJP tool to scale to larger sizes than are achievable using conventional techniques and systems.

14 Claims, 11 Drawing Sheets

(56) References Cited

U.S. PATENT DOCUMENTS

| | | | | |
|---|---|---|---|---|
| 4,810,966 | A * | 3/1989 | Schmall | G01V 3/104 |
| | | | | 324/207.17 |
| 4,893,071 | A * | 1/1990 | Miller | G01D 5/2451 |
| | | | | 324/660 |
| 5,247,190 | A | 9/1993 | Friend | |
| 5,703,436 | A | 12/1997 | Forrest | |
| 5,707,745 | A | 1/1998 | Forrest | |
| 5,721,608 | A * | 2/1998 | Taniguchi | B60R 16/027 |
| | | | | 355/68 |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,595,819 | B1 * | 7/2003 | Kitahara | B29C 41/006 |
| | | | | 118/624 |
| 7,279,704 | B2 | 10/2007 | Walters | |
| 7,431,968 | B1 | 10/2008 | Shtein | |
| 7,968,146 | B2 | 6/2011 | Wagner | |
| 2003/0159651 | A1 * | 8/2003 | Sakurada | B05B 13/0447 |
| | | | | 438/782 |
| 2003/0230980 | A1 | 12/2003 | Forrest | |
| 2004/0174116 | A1 | 9/2004 | Lu | |
| 2008/0309950 | A1 * | 12/2008 | Kwan | G03F 9/7053 |
| | | | | 356/616 |
| 2012/0304928 | A1 | 12/2012 | Koelmel | |
| 2013/0208036 | A1 * | 8/2013 | Forrest | B41J 11/008 |
| | | | | 347/8 |
| 2015/0223313 | A1 * | 8/2015 | Zhao | H01J 49/165 |
| | | | | 239/589 |
| 2016/0356629 | A1 * | 12/2016 | Tiapkin | G01D 5/2415 |
| 2017/0022963 | A1 | 1/2017 | DeBenedictis | |
| 2017/0291187 | A1 * | 10/2017 | van Putten | B41J 25/001 |

FOREIGN PATENT DOCUMENTS

| | | |
|---|---|---|
| CN | 102428204 A | 4/2012 |
| CN | 103620812 A | 3/2014 |
| CN | 105658742 A | 6/2016 |
| KR | 20130105409 A | 9/2013 |
| KR | 20130137585 A | 12/2013 |
| KR | 20140041616 A | 4/2014 |
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Chinese Office Action for App. No. CN201810426810.1, dated May 20, 2021, 8 pages.

Korean Office Action with English translation issued in App. No. KR10-2018-0051855, dated Jan. 30, 2023, 5 pages.

Korean Office Action (including English translation) issued in App. No. KR10-2018-0051855, dated Jul. 19, 2022, 7 pages.

* cited by examiner

CAPACITIVE SENSOR FOR POSITIONING IN OVJP PRINTING

CROSS-REFERENCE TO RELATED APPLICATIONS

This application is a non-provisional of, and claims the priority benefit of U.S. Provisional Patent Application Ser. No. 62/501,912, filed May 5, 2017, the entire contents of which are incorporated herein by reference.

FIELD

The present invention relates to systems and techniques for fabricating devices such as organic light emitting diodes and devices, such as organic light emitting diodes, made with or by and/or including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an organic vapor jet printing (OVJP) apparatus is provided that includes an OVJP print head, a capacitive sensor physically connected to the OVJP print head, a stage position adjustor configured to adjust the relative position of the OVJP print head and a substrate disposed below the OVJP print head, and a processing circuit in signal communication with the first capacitive sensor and the stage position adjustor and configured to provide a control signal to the stage position adjustor based upon a signal provided by the first capacitive sensor. The stage position adjustor may move the OVJP print head relative to the substrate, move the substrate relative to the print head, or perform a combination thereof. Multiple capacitive sensors may be used, such as where two sensors are used. In some embodiments, sensors may be positioned at either end of an OVJP print head, in front of and/or behind the OVJP print head relative to a direction of movement across a substrate, or combinations thereof. The print head may be moved during operation based upon the capacitive sensor signals to maintain alignment with one or more traces disposed on the substrate. The processing circuit may provide a real-time and/or closed-loop feedback system that maintains the OVJP print head in alignment with the trace on the substrate.

In an embodiment, a method of depositing material on a substrate via an OVJP process is provided, which includes operating an OVJP print head to deposit material on the substrate, receiving a first signal from a first capacitive sensor physically connected to the OVJP print head, and, responsive to the signal, adjusting a relative position of the OVJP print head and the substrate to maintain the OVJP print head in alignment with a trace on the substrate. The OVJP apparatus may be operated in some or all of the manners previously described and as disclosed in further detail herein. For example, the step of adjusting the relative position of the OVJP print head may be performed by moving the OVJP print head relative to the substrate, moving the substrate relative to the OVJP print head, or a combination thereof. The apparatus may include one or more capacitive sensors as disclosed herein, such as one- or two-comb sensors as previously described and as disclosed herein, which may be driven in phase to provide sensor signals to one or more control components as previously described and as disclosed herein.

A capacitive sensor as disclosed herein and as used in embodiments disclosed herein may be formed from a comb that includes a plurality of conductive electrodes connected to a common bus. In some embodiments, a capacitive sensor as disclosed herein may include another plurality of conductive electrodes connected to a second common bus separate from the common bus of the first plurality of electrodes, with the second plurality of electrodes being interdigitated with the first plurality of electrodes. In some configurations, the combs may be placed in relatively close proximity but not immediately interdigitated; for example, the second comb may be placed an electrode-width behind the first relative to a direction of movement of the assembly and substrate, and laterally offset from the first, such that the combs would be interdigitated if aligned laterally. The two combs may be driven in phase during operation of the OVJP apparatus.

BRIEF DESCRIPTION OF THE DRAWINGS

FIG. 2 shows an example of an inverted organic light emitting device that does not have a separate electron transport layer that can be fabricated using embodiments disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
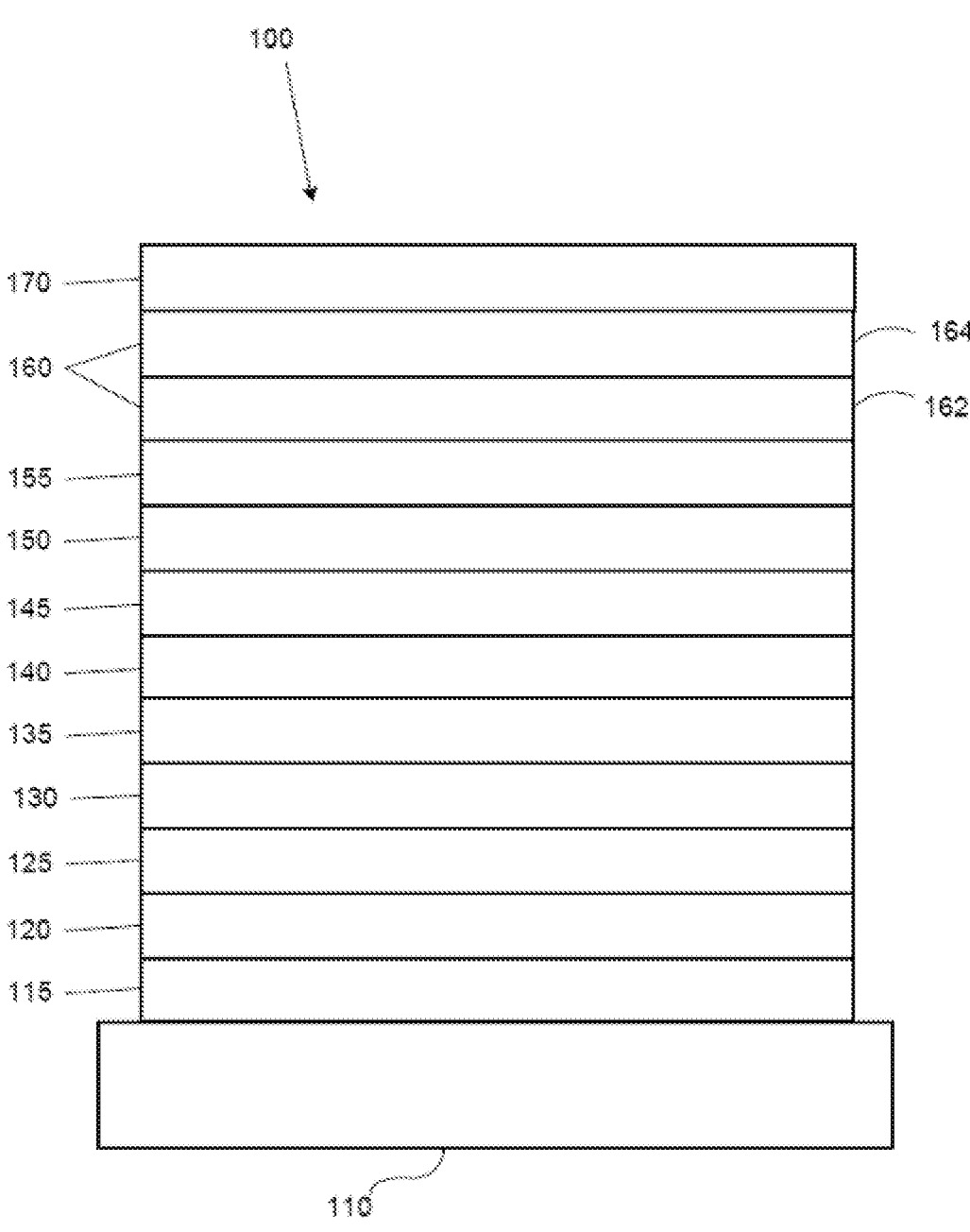
FIG. 1 shows an example of an organic light emitting device that can be fabricated using embodiments disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
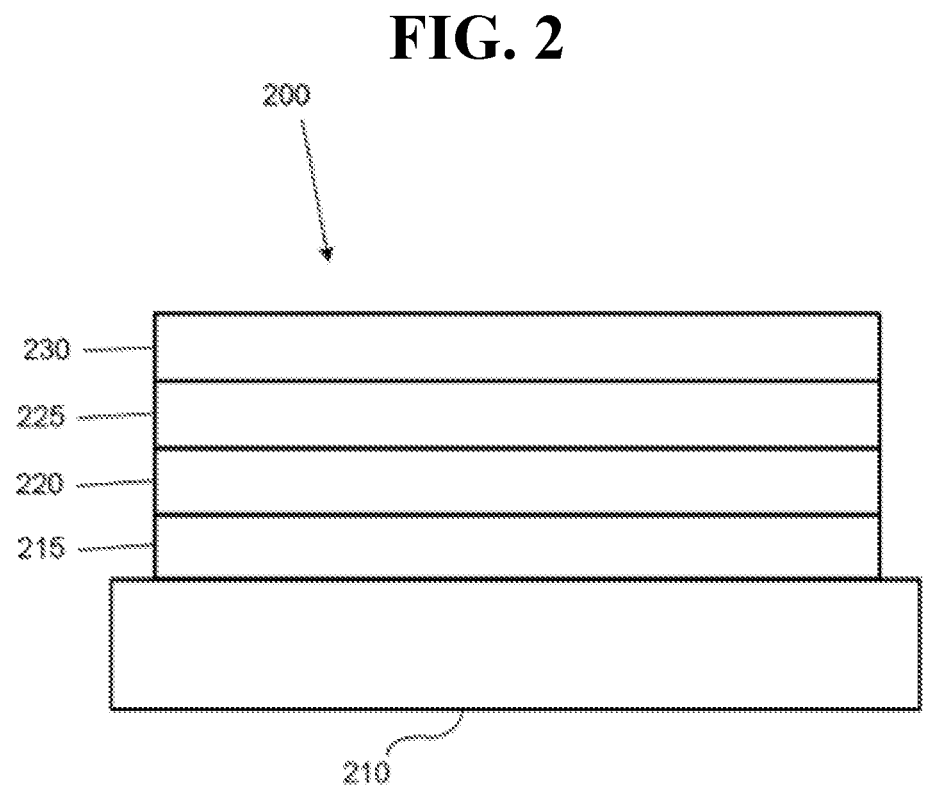

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, one type of technique for fabricating OLED devices is organic vapor jet printing (OVJP). OVJP allows for concurrent growth and patterning of the emissive layers of individual red, green, and blue OLED subpixels in a display without the use of shadow masks or liquid solvents. OVJP ejects jets of organic vapor formed by a print head onto a substrate. The locations where the organic material condenses depend on the relative positions of the print head and the substrate. The depositors of the print head are therefore aligned to the subpixel electrode on the substrate. Typically the alignment is desired to be within a fraction of a subpixel width to achieve desired printing tolerances. If the jets are off-center, for example because of unintended relative movement between the deposition apparatus and the substrate, various undesirable conditions may result. For example, the resulting films may have a non-uniform film thickness over the subpixel, or the jets may overspray onto neighboring subpixels.

For example, a current-generation 55" class ultra-high-definition OLED TV features 50 μm subpixels, which generally is considered to require an alignment accuracy of ±5 μm. Tolerance scales inversely with resolution, so an 8K display will require even greater accuracy.

To properly align an OVJP deposition system with a substrate on which organic materials are to be deposited, conventional methods such as optical fiducials may be used to home the substrate to the stage coordinate system. However, such techniques are "open loop" techniques, i.e., there is no feedback mechanism to correct a system that becomes mis-aligned during deposition. For example, in a conventional optical technique, an OVJP deposition system stores the position and orientation of the substrate at the start of the deposition process and uses it to define a transform between substrate and stage coordinates. The system then places each subpixel or other component being printed by moving the stage relative to the depositor by a series of known amounts prescribed in substrate coordinate system. Although this method works acceptably well for relatively small substrates, uncertainties increase for larger stages and substrates. Accordingly, such techniques typically are not suitable for substrates of about 500 mm or larger.

In general, it is known that the reproducibility of stage movements in conventional OVJP systems tend to decrease as their range of motion increases. The positioning tolerances between clusters of features within a substrate generally scale with substrate size. As a result, although individual features may be correctly positioned relative to their neighbors, cumulative errors can lead to gross inaccuracies at larger scales. Moreover, OVJP deposition systems usually create a temperature gradient within the substrate underneath the print head. This can cause the substrate to shift position relative to the stage due to thermal expansion.

To solve this and other potential issues with OVJP deposition while maintaining deposition accuracy and speed at larger scales, closed-loop position sensing techniques and systems as disclosed herein may be used. A closed-loop position sensor as disclosed herein allows the position of the print head with respect to features on the substrate to be monitored and corrected while printing is underway. This allows the initial optical alignment to be continuously corrected so that printing accuracy is maintained during deposition, without the need to stop printing and/or recalibrate the OVJP deposition system during a pause in printing.

Figure 3:
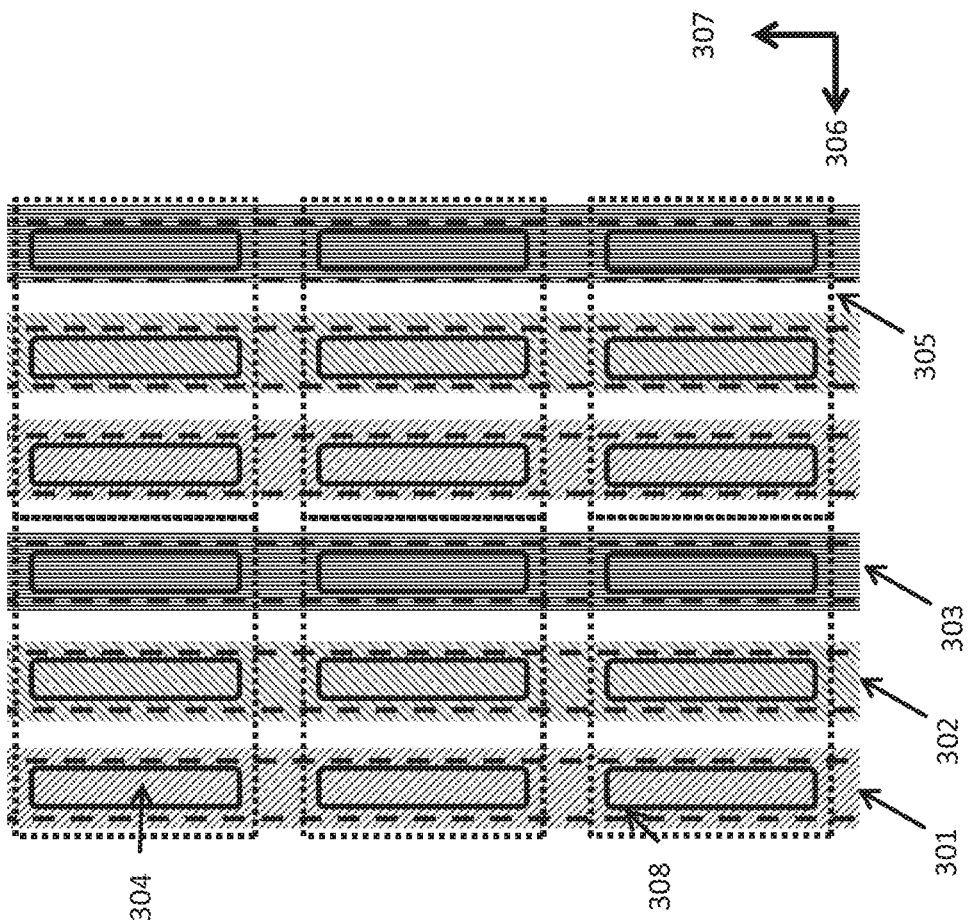
FIG. 3 shows a backplane of an example OLED array with red, green, and blue subpixels suitable for fabrication according to embodiments disclosed herein.

In some embodiments, a closed-loop sensor used with OVJP deposition techniques as disclosed herein is able to measure relative position accurately in at least one axis. Structures printed by OVJP usually include arrays of parallel lines of deposited material that should be positioned to a relatively tight tolerance, for example within 5 μm, with respect to rows of electrodes on the substrate, but which do not require their length to be held to such tight tolerance. That is, generally only a single axis of relatively high precision measurement and deposition on the surface of a display or similar device is required for acceptable performance. For example, a typical application of OVJP is the deposition of a set of RGB pixels illustrated in FIG. 3. Stripes of red (301), green (302), and blue (303) thin film emissive materials are printed over blanket thin film transport layers and/or other layers of an OLED on a substrate such as a display backplane. The stripes align with rows of electrodes 304 on the backplane that provide current to form OLED subpixels of three different colors. A set of adjacent red, green, and blue subpixels form a full-color pixel 305. Each of the six pixels in the illustration is offset by the dotted line. An RGB pattern as shown in FIG. 3 can be printed as stripes if the pixels are aligned so that the subpixels of a given color are co-linear. The placement of printed stripes along the direction 306 perpendicular to the line of subpixels becomes more critical than the length of the stripe 307. The electrodes of co-linear subpixels often overlay parallel conducting traces 308, the borders of which are shown in FIG. 3 by dashed lines. As disclosed herein, it has been determined that a print head capable of tracking its position relative to these traces will remain in the correct position with respect to the substrate to deposit lines of emissive materials and/or other organic materials as shown in FIG. 3.

Figure 4:
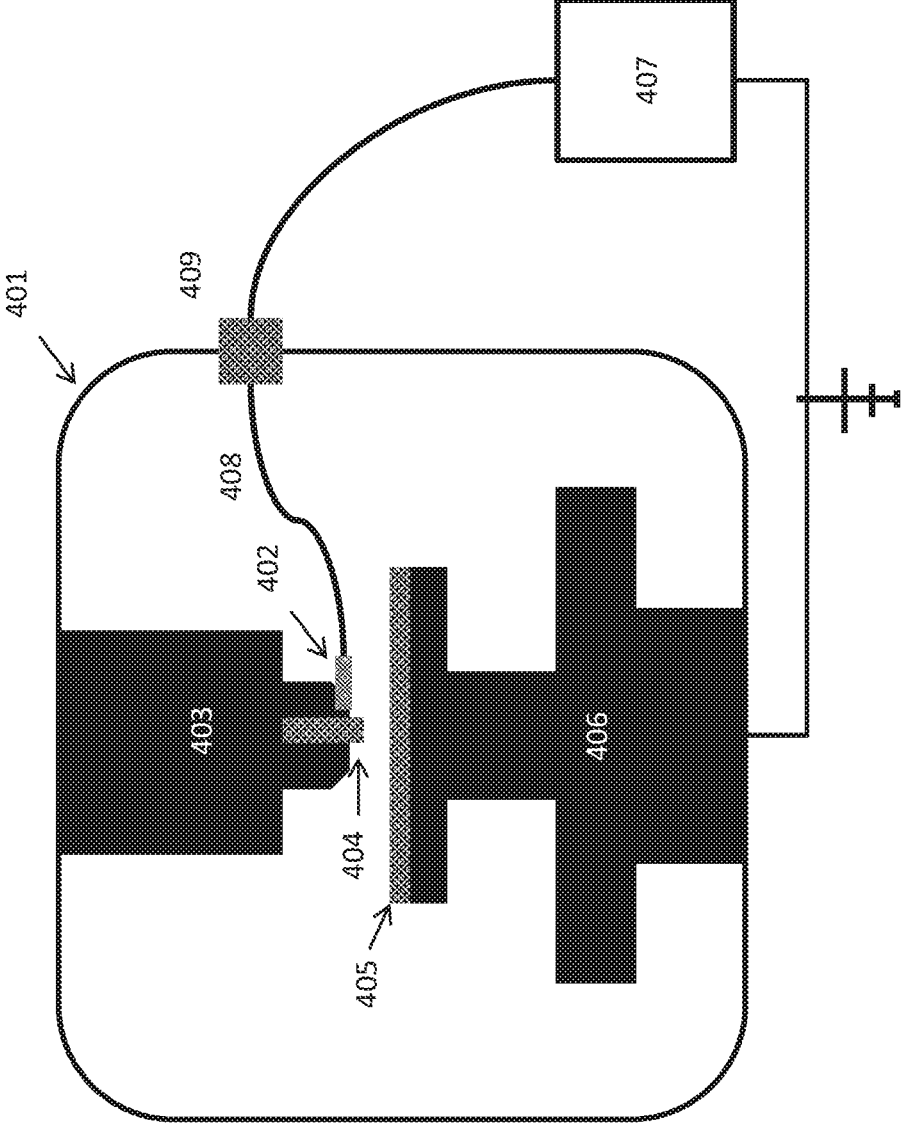
FIG. 4 shows an example of a capacitive position sensor according to an embodiment disclosed herein.

FIG. 4 shows an example of an OVJP deposition system as disclosed herein. OVJP is a thermal process and the print head is generally maintained at temperatures greater than 300° C. The OVJP deposition process is performed in a controlled environment such as a vacuum chamber 401. According to embodiments disclosed herein, a position sensor 402 is mounted on the OVJP print head 403. It may be desirable to mount the position sensor in close proximity to the OVJP nozzle or micronozzle array 404, so as to more easily determine a true position of the nozzle 403 relative to the substrate 405 based upon sensor information obtained by the position sensor 402.

In OVJP techniques, it generally is desirable to minimize or eliminate any outgassing from components within the chamber, particularly from those components that are closest to the printing zone. Accordingly, it is desirable for the sensor 402 not to significantly outgas, even at elevated temperatures.

It has been determined in the present disclosure that at least some capacitive sensors can operate at sufficiently high temperatures and can be made from non-outgassing materials to provide a suitable sensor for OVJP systems and techniques as disclosed herein. Mechanically, a capacitive sensor suitable for use with embodiments disclosed herein need only include an electrode that is isolated from a grounded target by a relatively high electrical resistance.

For example, referring to FIG. 4, the target may be the substrate 405, which rests on a motion stage 406 that is movable relative to the substrate 405. The electronics 407 used to excite the electrode and interpret its return signal may be disposed outside the chamber 401, in which case they may be connected to the sensor through electrically shielded cables 407 and a hermetically sealed feedthrough 408.

Figure 5:
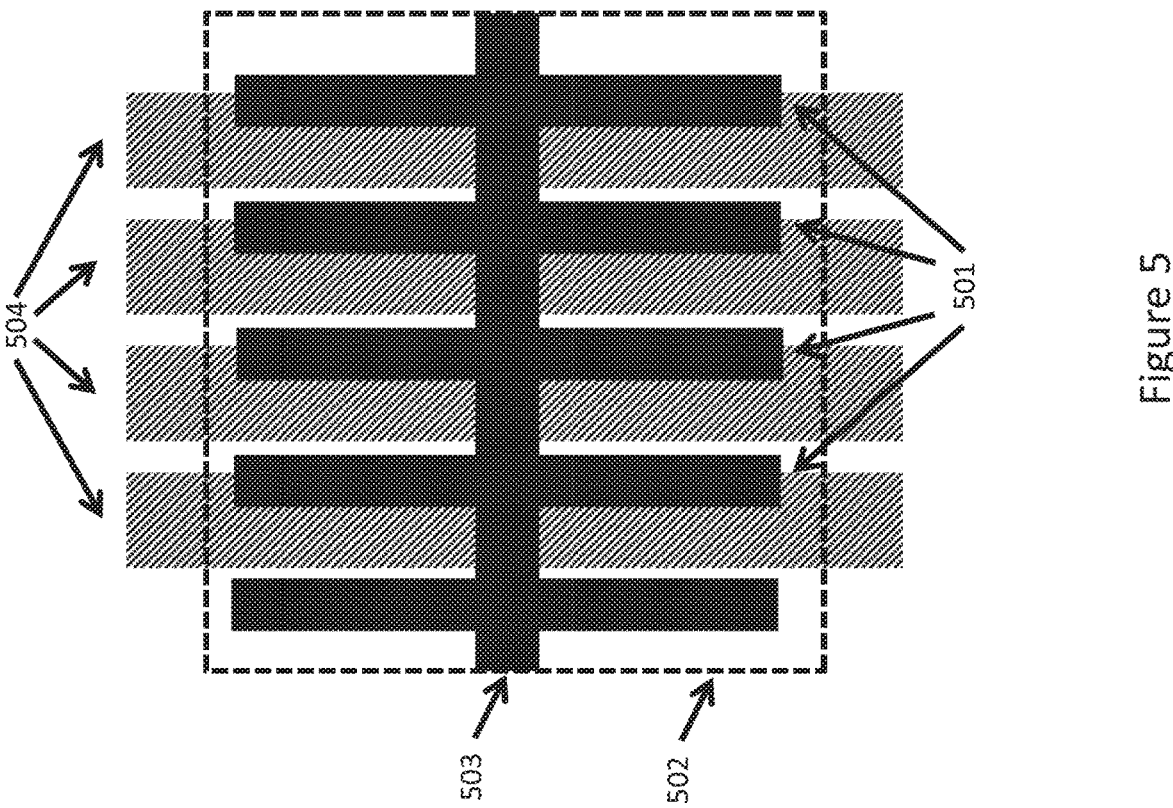
FIG. 5 shows an example of a capacitive position sensor with a single comb according to an embodiment disclosed herein.

FIG. 5 shows a top schematic view of a capacitive distance sensor according to embodiments disclosed herein, looking down from the OVJP deposition assembly (not shown) toward a substrate on which material is to be deposited. The sensor may include of an array of conductive electrode stripes 501. The strips may be made of a thin film metal and referred to collectively as a comb. The stripes of such a comb may be deposited by ay suitable technique, including electroplating, physical vapor deposition, aerosol printing, or the like. The comb is disposed above an electrically insulating layer 502 formed of plastic, glass, ceramic, or the like, or combinations thereof. Examples of appropriate thin film metallization include 200 Å Ti, 300 Å Pt, 10,000 Å Au, or similar layers deposited sequentially on the comb by e-beam evaporation or other suitable deposition techniques. The comb and insulating layer travel with the OVJP print head, and may be physically connected to the print head or a common support assembly.

The electrodes 501 may be connected by a central bus electrode 503 that is, in turn, connected to a signal processor. As previously disclosed, the signal processor may be external to the deposition chamber and connected to the electrode assembly 501/503 via a shielded cable or the like.

The electrodes face the substrate on which the OVJP deposition system is arranged to deposit material. Capacitance is generated by the overlap of the comb with the conductive traces 504 in the substrate. If the comb 501/503 and the conductive traces 504 have the same physical period, the capacitance signal is maximized when they overlay each other and minimized when the electrodes of the comb overlay the gaps between the traces. The position of the comb relative to the substrate traces can then be determined to within a period.

Figure 6:
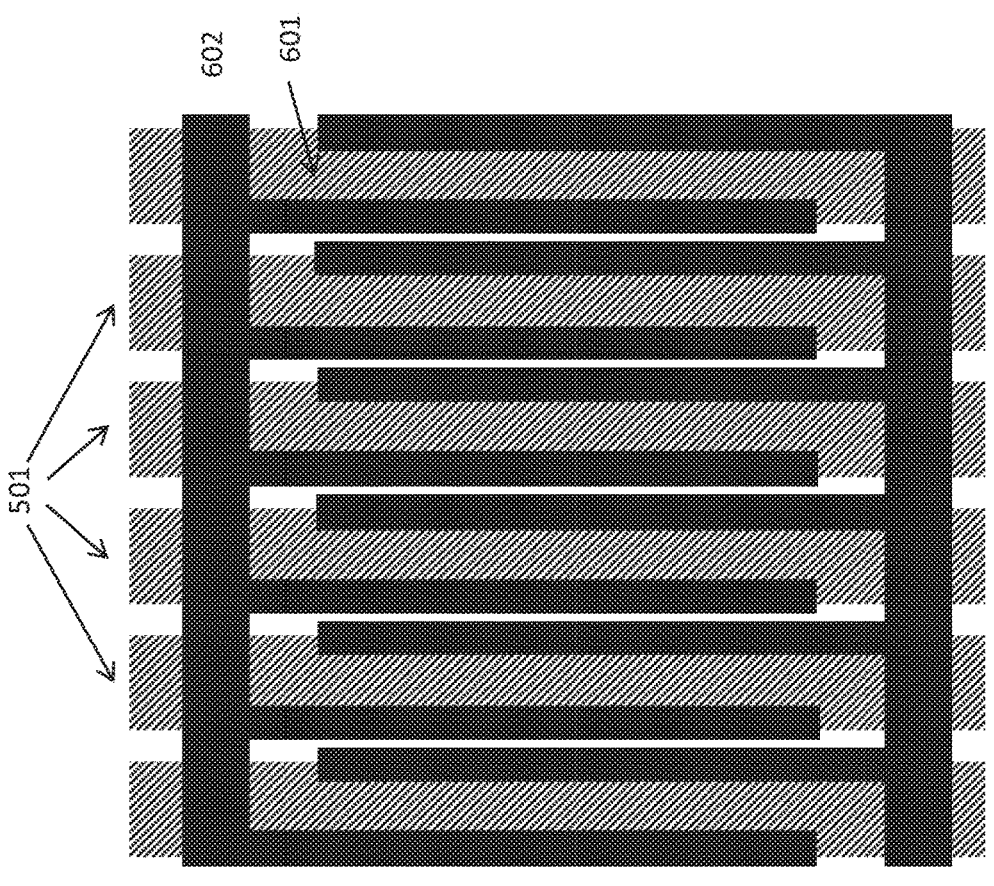
FIG. 6 shows an example of a capacitive position sensor with two interdigiated combs according to an embodiment disclosed herein.

FIG. 6 shows a top schematic view of another capacitive distance sensor according to embodiment disclosed herein, which includes multiple interdigitated combs. Specifically, in this arrangement, two interdigitated combs 601 are arranged so that an electrode from each comb straddles a trace 501 below the combs. Each of the two combs is connected to a separate bus 602. Thus, the arrangement includes two comb components in electrical connection with separate buses that are electrically insulated from one another. Because the combs are arranged such that, when positioned in the desired location relative to the underlying trace each comb includes a stripe that is positioned at the same distance from the underlying trace, the capacitance signal from each of the two combs is equal when the comb is properly aligned to the traces. In some configurations the combs may not be directly interdigitated, but may operate sufficiently similarly to a directly interdigitated configuration to achieve comparable sensor results. For example, the second comb may be placed in close proximity to, but following the first comb relative to a direction of relative motion of the OVJP print head and the substrate. The second comb may be within one comb length of the first, but offset laterally from the first comb such that, when overlayed with one another, the two combs would form an interdigitated structure.

As previously disclosed, the sensor shown in FIG. 6 may be physically connected to or otherwise may move concurrently with an OVJP deposition apparatus according to embodiments disclosed herein. As the deposition apparatus moves across the traces, the capacitance of one comb will increase and the other will decrease if the sensor moves to one side. For example, as a deposition apparatus connected to a sensor as shown in FIG. 6 moves in a direction parallel to the traces, i.e., toward the top or bottom of the page, the capacitance measured for each comb will remain constant as long as the same alignment between the combs and the traces is maintained. If the comb moves, for example, to the left in the arrangement shown in FIG. 6, then the capacitance of the upper comb will decrease as a smaller surface area of the upper comb electrodes is disposed over (i.e., aligned with) the underlying traces. Similarly, the capacitance of the lower comb will increase as the surface area of the lower comb electrodes is disposed over the traces. The signal or signals generated by these changes in capacitance can then be used to drive feedback control of the stage and thus the relative position of the substrate and the OVJP deposition apparatus, so that the print head remains correctly centered perpendicular to the traces while it is printing stripes of organic material parallel to the traces. That is, the use of dual combs as shown in FIG. 6 permits for comparative measurement, which has the additional advantage of decoupling the lateral position measurement from the distance between the combs and the substrate. Because multiple combs are used, it is possible to determine whether a change in capacitance is due to the substrate moving farther away from the sensor (i.e., in the z direction), or due to the substrate and sensor coming out of alignment due to lateral (y direction) motion.

To achieve continuous alignment during OVJP deposition processes, one or more stage position adjustors may be used to adjust the relative position of the OVJP print head and the substrate on which materials are being deposited. For example, motors, actuators, and/or similar components may be driven by a processing circuit to adjust the relative position of the print head based upon position data obtained from one or more capacitive sensors, such as those shown in FIGS. 5-10. As a specific example, arrangements such as those shown in FIGS. 7-9 may be mounted on a housing that can be moved laterally across the substrate by one or more motors, belt drives, or the like, in response to position signals generated by the capacitive position sensors as previously disclosed.

In some embodiments, typical dimensions for an individual stripe electrode in a comb as disclosed herein is in the range of 10-30 μm in width and 0.5-1.5 mm in length. It may be preferred for the electrodes to be about 20 μm wide and about 1.0 mm long. The electrode may be positioned on a plane about 10-75 μm, in some embodiments preferably about 30-70 μm or more preferably about 50 μm, above the substrate and parallel to it. Each comb may have 100 or more stripe electrodes, although the advantages and arrangements disclosed herein are not dependent upon having any particular number of electrodes. In some embodiments it may be desirable for the number of electrodes to be the same as the number of traces over which material is to be deposited, or a significant fraction of the number of traces. For example, it may be desirable to have ⅕, ¼, ½, or more of the number of trace columns. For large mass-production deposition systems using Gen5 or larger glass substrates, the number of traces may be much smaller than the number of columns, and accordingly smaller sensors may be placed periodically along the print head.

The capacitance C of a parallel plate capacitor is given by $$C = \varepsilon A/d$$

where ε is the permittivity of the material between the plates, A is the area of the plate overlap and d is the distance between the plates. Accordingly, a 100 stripe electrode comb will generate approximately 0.35 pF capacitance over a typical substrate. This capacitance may be measured directly at the individual electrode or, as previously disclosed, a bus may be used to measure capacitance of the electrodes in the comb. The capacitance of the "capacitor" formed by the comb electrodes and the trace(s) on the substrate over which the comb is disposed may be referred to herein as the capacitance of the comb, or the capacitance measured at or generated by the comb.

Figure 11:
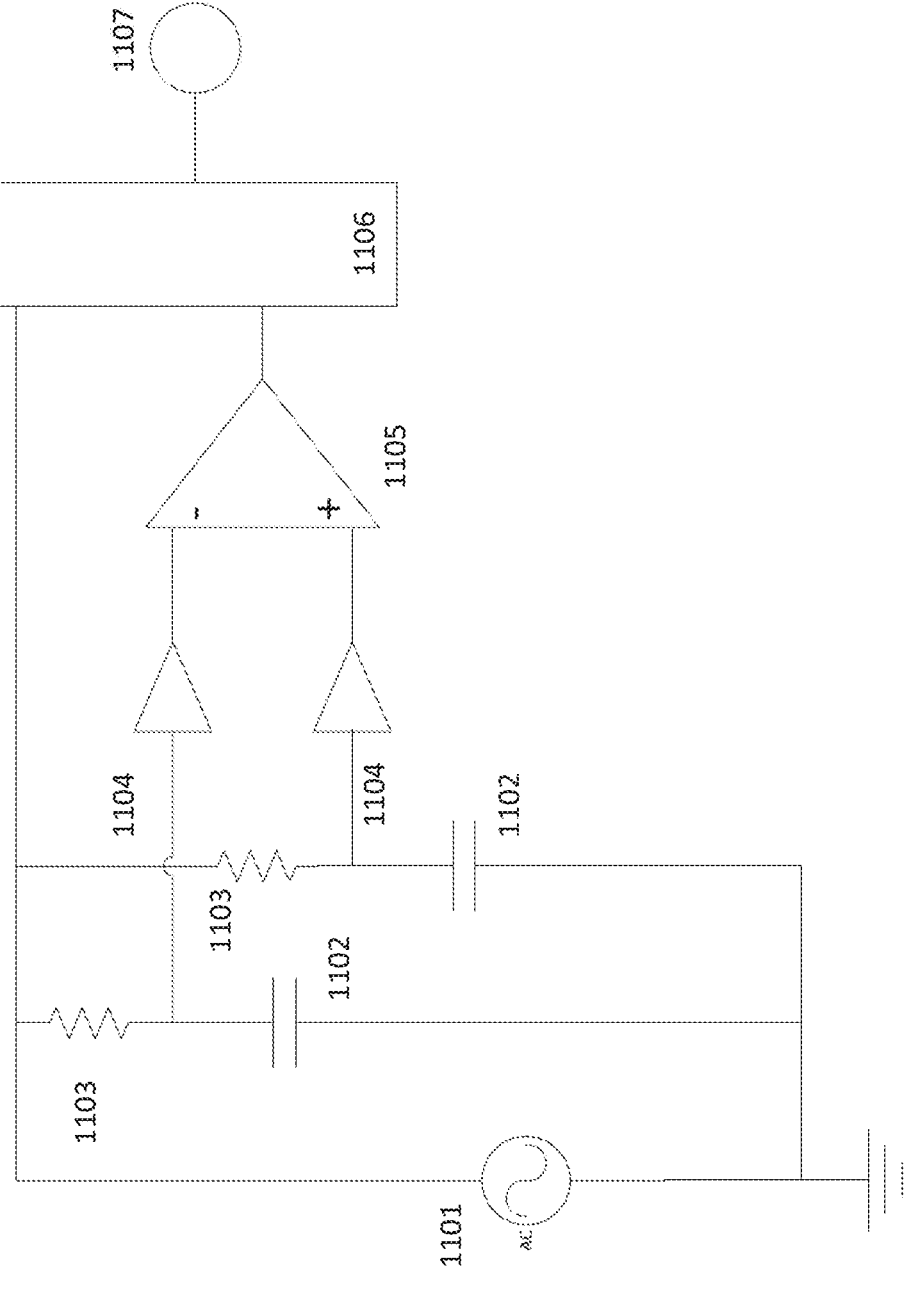
FIG. 11 shows a circuit diagram of a capacitive position sensor and related signal processing electronics according to an embodiment disclosed herein.

FIG. 11 shows an example circuit suitable for processing signals generated by interdigitated comb sensors according to embodiments discloses herein. An alternating current signal 1101 may be fed into each of the comb electrodes of each sensor 1102. It may be preferred to drive the two comb electrodes in phase with each other to obtain the most accurate sensor signal. The sensors behave as capacitors as previously disclosed. If appropriately-sized resistors 1103 are placed between them and the AC source, the resistors and capacitors will act as low pass filters. Each filter will attenuate the signal by an amount dependent on its capacitance. The signal from each capacitor may be amplified by a pre-amp 1104 before the two signals are compared by a differential amplifier 1105. The differential amplifer magnifies the difference between the two signals, thereby extracting sufficient information that the substrate traces may be tracked as previously disclosed herein. Notably, a positive voltage signal suggests a correction in one direction and a negative signal in the other, thereby allowing systems as disclosed herein to determine the direction in which a depositor has moved relative to the substrate as previously described.

The signal may be further processed using devices such as lock-in amplifier 1106, a rectifier in series with a low pass filter, or other components as will be understood by one of skill in the art. A voltage output 1107 may be generated that can be logged and used to control the OVJP process in a closed-loop system as previously disclosed. As a specific example, assuming each comb has a capacitance of 0.125 pF when overlapping the substrate traces by 50%, a 600 kΩ resistor would be appropriate for filtering a 2 MHz signal. More generally, the cutoff frequency f of a low pass filter is given by f=1/(2πRC), where R is the resistance of the resistor between the signal source and the comb and C is the capacitance between the comb and the substrate. The signal admitted through a low pass filter is sharply attenuated as the cutoff frequency is exceeded. Therefore, if the comb is excited at approximately the cutoff frequency, the signal it generates will become significantly weaker as capacitance increases and stronger as the capacitance decreases. Accordingly, it may be desirable for the combs to have the highest capacitance possible within the geometric constraints of the system, and the resistance R may be chosen so that the cutoff frequency for each comb is at a convenient value.

In some embodiments, an initial optical alignment may be used to determine the appropriate substrate position and orientation on the stage of a capacitive sensor as disclosed herein. Once the initial position is determined, the print head and substrate make an initial open-loop move with respect to each other. Further moves perpendicular to the traces are subject to closed loop control as previously disclosed. That is, after the initial alignment, a capacitive sensor as disclosed herein may be used to provide relative position information of the substrate and OVJP print head in a closed loop system that maintains the desired relative position. This prevents positioning errors while correcting for irregularities in the substrate. The sensor may be used to seek a path parallel to the substrate traces as previously described.

In some embodiments, a capacitive sensor and associated system as disclosed herein may be used in a manner analogous to an encoder, in which cycles of high and low signal are counted for each move and used to track net displacements in the perpendicular direction. In normal operation, the signal may be used to control perpendicular motion of the print head so that there is no perpendicular motion relative to the substrate and the signal remains constant, as previously disclosed. By tracking the net displacement, any angular mis-alignment of a moving substrate may be tracked and subsequently corrected by mechanical adjustment, such as by using the position adjustment techniques disclosed herein.

Figure 7:
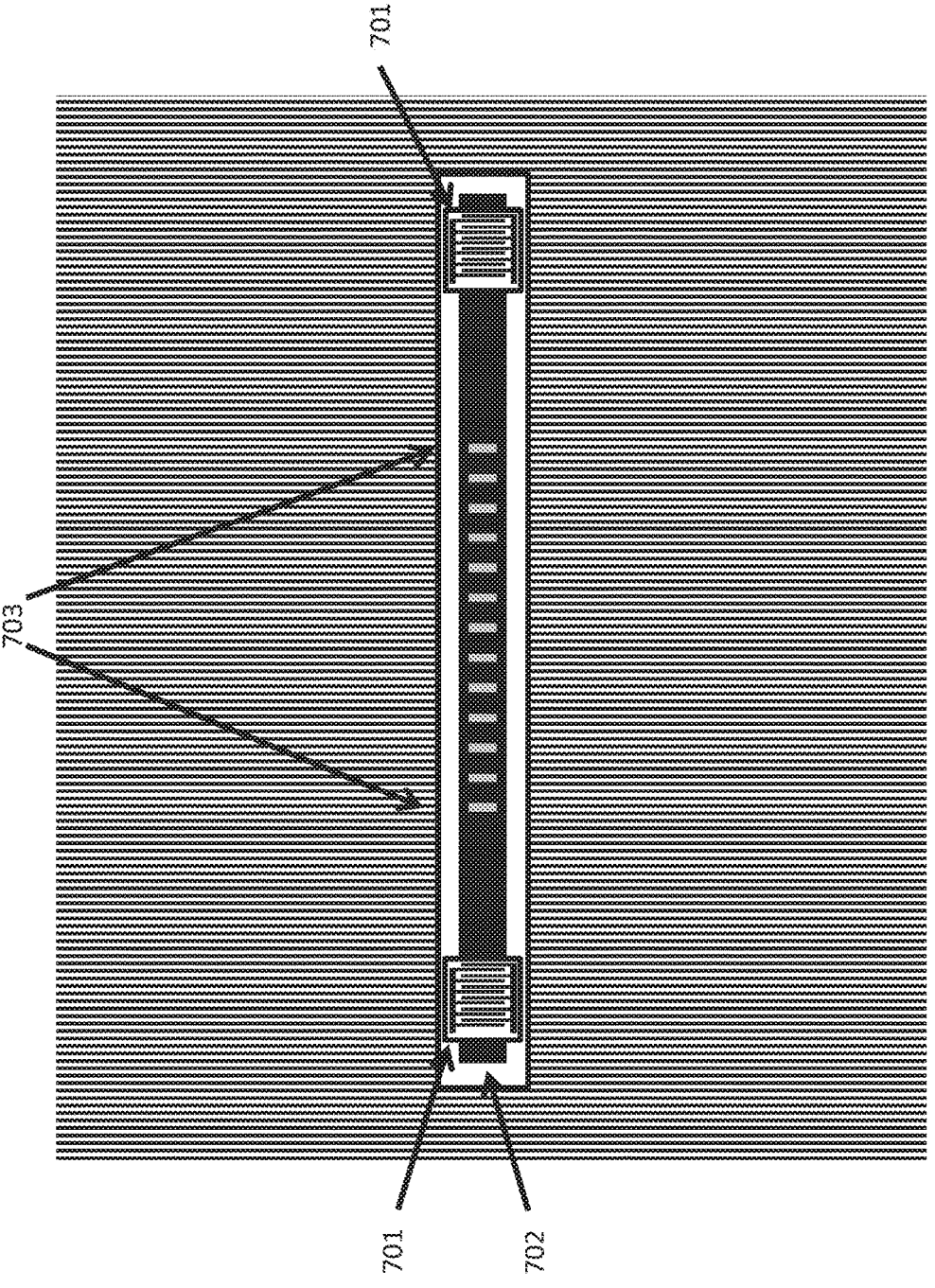
FIG. 7 shows a pair of capacitive position sensors mounted on an OVJP micronozzle array according to an embodiment disclosed herein.
Figure 8:
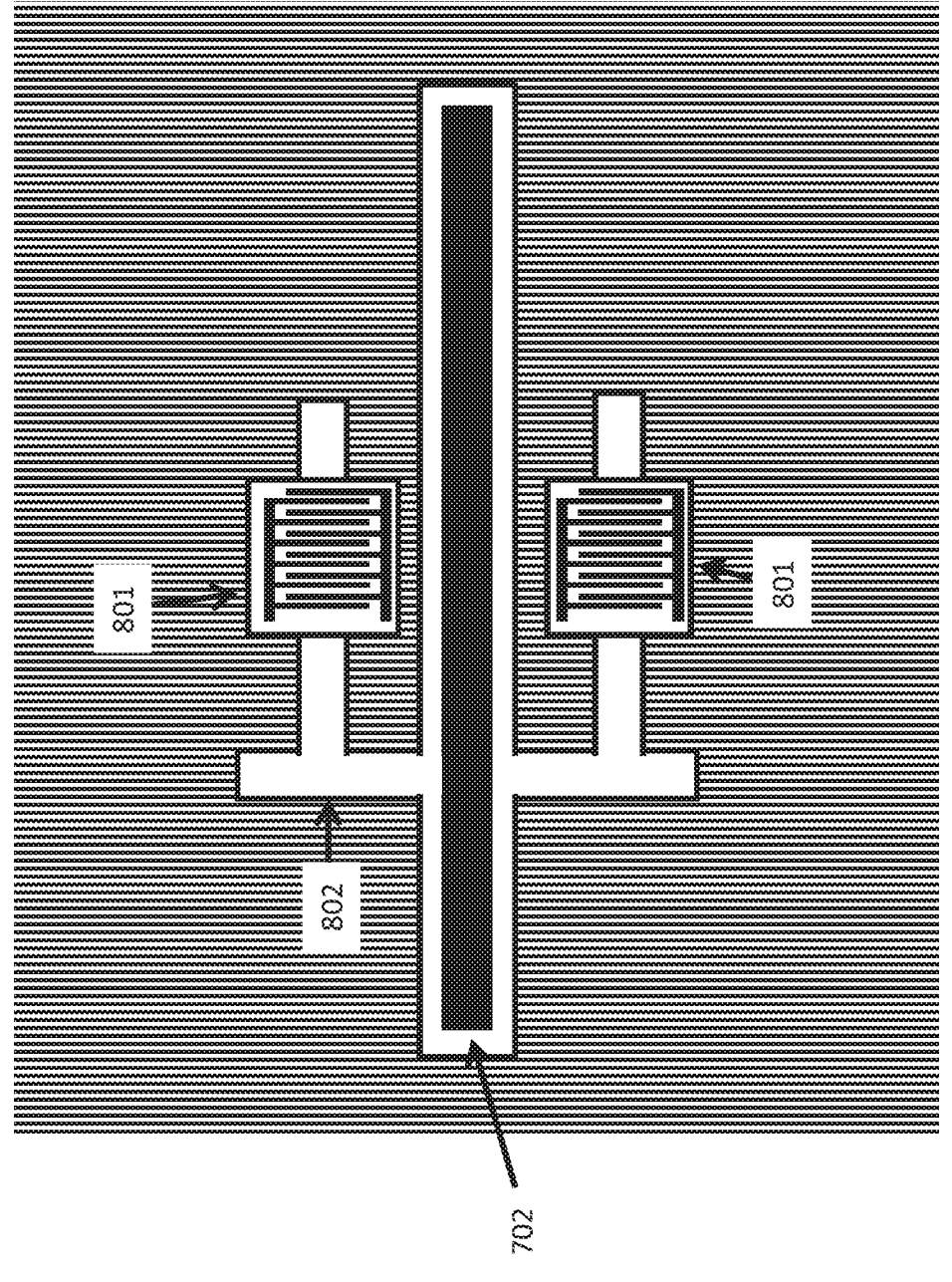
FIG. 8 shows a pair of capacitive position sensors mounted on the front and rear of a print head apart from the micronozzle array according to an embodiment disclosed herein.

As previously disclosed, a sensor as disclosed herein generally is rigidly mounted on, or relative to, the OVJP print head. Thus, the position relative to the OVJP depositors does not change during a printing operation. FIGS. 7 and 8 show example arrangements of the sensor and OVJP apparatus as disclosed herein. It will be understood that other arrangements may be used without departing from the spirit and scope of the embodiments disclosed herein. FIG. 7 shows a schematic view of a system in which the capacitive sensors 701 are mounted directly on a micronozzle array 702 at known distances from the depositors 703. The view in FIG. 7 is from above the deposition apparatus toward the substrate. Such an arrangement may be accomplished using any suitable microfabrication technique. As a specific example, the combs of the sensors may be deposited on a free-standing oxide membrane to reduce the parasitic capacitance from the bulk silicon of a conventional micronozzle array. Alternatively or in addition, additional distance, other insulating components, other materials, or the like may be used to further protect the sensors from any undesirable influence from the rest of the OVJP system such as parasitic capacitance, shorting of the combs, or the like.

FIG. 8 shows another example arrangement in which one or more sensors 801 may be attached to the print head by means of linkages 802. The linkages 802 may be sufficiently adjustable to permit alignment of the combs to the micronozzle array. Alternately or in addition, the position of the micronozzle array may be adjustable relative to the sensors. For example, piezoelectric motors may be used to make the small positional corrections required to orient the sensors and micronozzle array to each other. Such an arrangement may allow for more fine-grained control and/or continuous adjustment of the relative position of the capacitive sensors relative to the other components of the OVJP deposition system. The arrangement in FIG. 8 includes two sensors 801, one in front of the print head 702 and the other behind it relative to the relative direction of movement of the print head 702 and the substrate. That is, the example shown in FIG. 8 typically would move in a direction up or down the page, i.e. parallel to the traces on the substrate. This allows the parallelism of the micronozzles and the substrate traces to be measured to a very high degree of accuracy. Furthermore, it allows the print head to move to the edge of the traces on the substrate, since either the leading or trailing sensor will be still be positioned over traces on the substrate and therefore will still be able to provide alignment data as previously disclosed.

Figure 9:
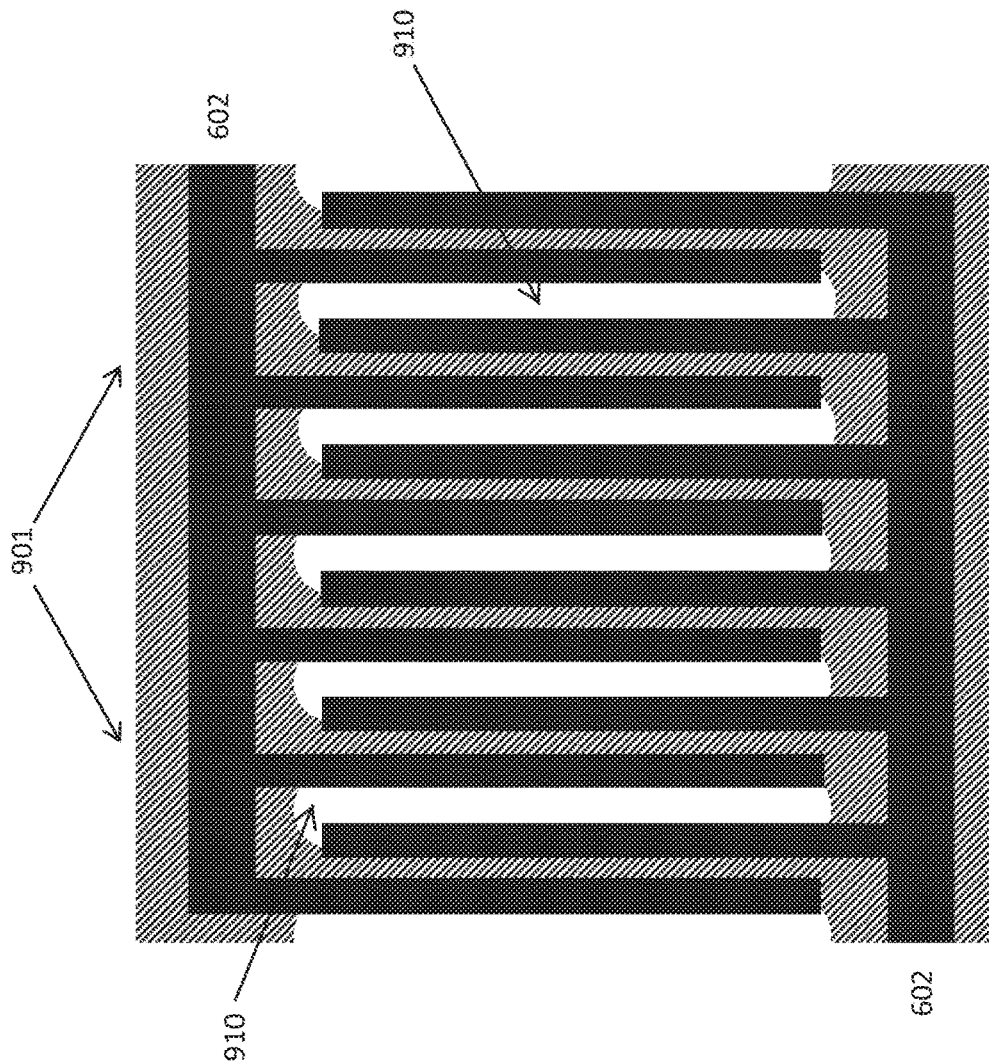
FIG. 9 shows an example of a capacitive position sensor used to determine position relative to lines of dielectric according to an embodiment disclosed herein.

A capacitance sensor also may be used to detect the presence of a dielectric material between a conductive substrate and the combs. FIG. 9 shows a schematic of an example substrate that is coated with a continuous conductive film 901 such as ITO. The conductive film is coated with a dielectric material, such as photoresist, everywhere except for bare regions 910 that may have been formed, for example, by photolithography or a similar process. A conduction path exists at these bare regions, so they act as electrodes for the thin film devices deposited over them. The capacitance between the combs and the substrate is slightly higher in regions covered with the dielectric material 801 than the bare regions 910. A two-comb sensor therefore may be used to determine whether a micronozzle array is correctly straddling rows of electrodes on a neat conductive film in a manner analogous to detecting electron traces in the previous case. Thus, a capacitive sensor arrangement as used herein also may be used to measure and adjust alignment of an apparatus above such a substrate.

Figure 10:
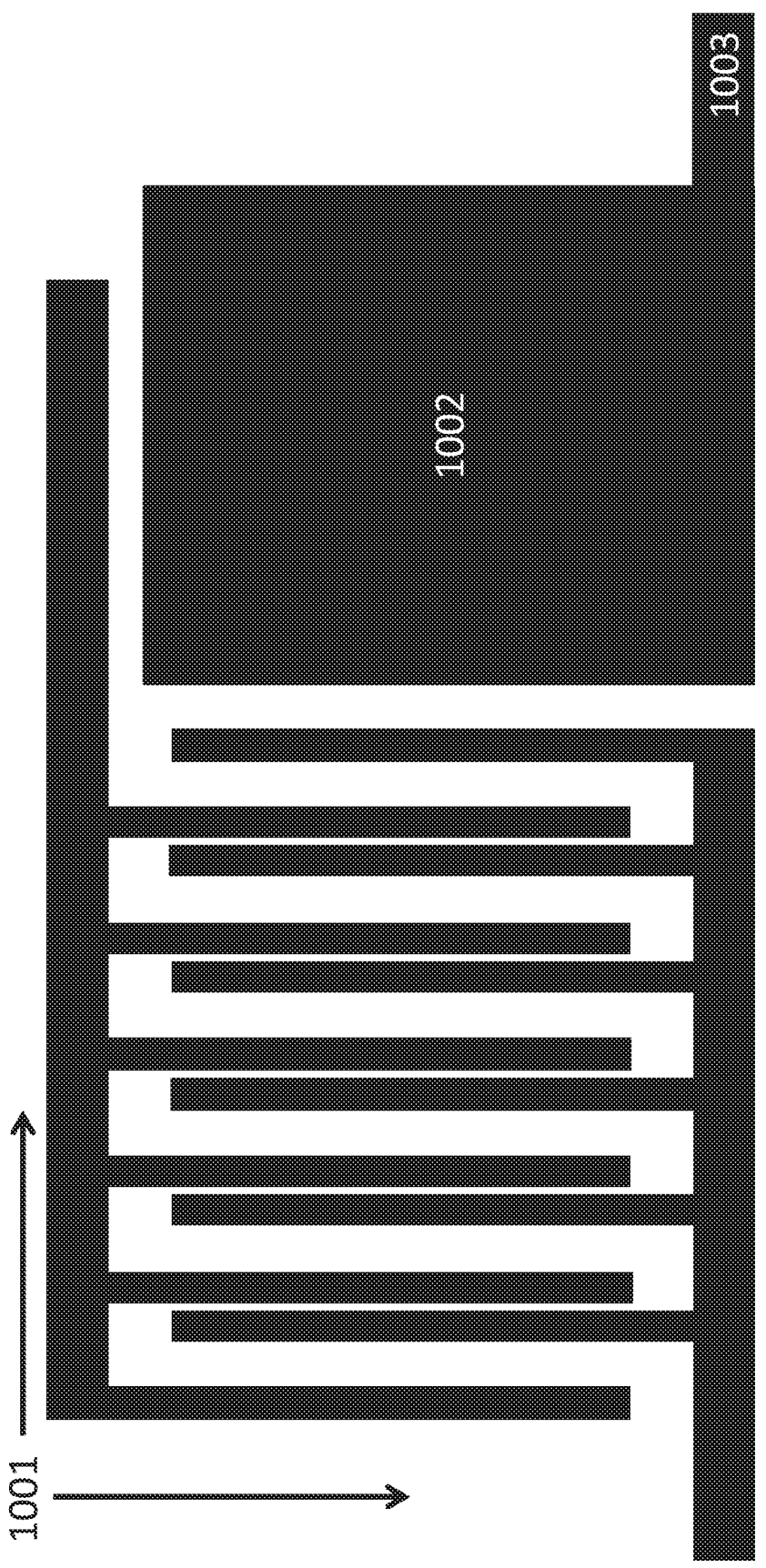
FIG. 10 shows a capacitive position sensor capable of measuring lateral position and the normal distance between the substrate and the sensor according to an embodiment disclosed herein.

In some embodiments, capacitance sensing arrangements and techniques as disclosed herein also may be used to determine a fly height separation between an OVJP print head and the substrate. For example, FIG. 10 shows a schematic representation of a combination of position and fly height sensors that are arranged in a single plane. The two-comb sensor configuration 1001 is the same as previously disclosed with respect to FIG. 6. An electrode 1002 may be used to measure the gap between itself and conductive elements of the substrate based upon the measured capacitance in the region of the electrode. The electrode may be rectangular and may be larger than individual comb electrodes. Specifically, because OVJP substrates generally are not uniformly conductive, for example due to the presence of traces as previously disclosed, it may be desirable for the fly height sensor to have a sufficiently large area that its capacitance is sufficiently influenced by a representative sample of the substrate so as to be detectable and the conductive area coincident with it does not change with position. Any detected changes in capacitance therefore will be at least primarily, if not entirely, due to changes in the separation d between the fly height sensor electrode and the substrate. Accordingly, in some embodiments it may be useful for the total surface area of the additional electrode 1002 to be at least equal to the area of ten comb periods of interdigitation. Fly height sensors may be placed on opposite ends of a micronozzle array in a manner analogous to that described with respect to FIG. 7. The separate fly height readings from each side of the micronozzle array can be fed into an active control system to ensure that the array is not tilted with respect to the plane of the substrate. Alternatively or in addition, the use of one or more fly height sensors as disclosed herein may be used to adjust the position of OVJP depositors relative to the substrate where the substrate is not entirely planar, for example by tilting the depositors to match the substrate orientation. Such uses are described in further detail in U.S. Application Publication No. 2018/0323372, the disclosure of which is incorporated by reference in its entirety.

The fly height sensor electrode may have a dedicated bus 1003 that is electrically separate from the buses of the upper and lower combs as previously disclosed.

Embodiments disclosed herein allow for more precise and efficient positioning of OVJP deposition systems than is achievable with conventional OVJP systems, including during operation of the system to deposit material on a substrate. Notably, systems and techniques disclosed herein do not rely on any additional material or component in the substrate, since electrode traces that are already present on the substrate for subpixel operation may be used to achieve the capacitive sensor arrangements disclosed herein. Embodiments disclosed herein may be operated in a real-time feedback loop to maintain a desired alignment of the OVJP deposition system and the substrate on which it is depositing material. As used herein, the process is considered "real-time" if it happens with no delay other than the delay inherent in signal propagation and processing within the system, such as the time required for capacitance measurements to travel from the sensor to a processing system, and the processing system to operate one or more mechanical components that adjust the position of the OVJP print head. All operations disclosed herein also may be performed entirely automatically by computerized processing systems without the need for human intervention or adjustment. For example, embodiments disclosed herein may provide real-time adjustment of the OVJP print head position during the printing process without human intervention.

Due to the use of conductive traces, embodiments disclosed herein may be particularly well-suited for fabrication of side-by-side RGB devices, i.e., devices that use adjacent rows of red, green, and blue subpixels. However, they may be used with other architectures and arrangements that include similar traces on the substrate that may be used to align the OVJP print head with the desired area on the substrate. For example, trace arrangements other than the parallel lines shown in various examples disclosed herein may be used.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) apparatus comprising:
an OVJP print head;
a first capacitive sensor physically connected to the OVJP print head;
a second capacitive sensor physically connected to the OVJP print head;
a processing circuit in communication with the first capacitive sensor and the second capacitive sensor, and configured to provide a control signal based upon a signal provided by the first capacitive sensor;
a stage position adjustor in communication with the processing circuit and configured to adjust the relative horizontal alignment of the OVJP print head and a substrate disposed below the OVJP print head based upon the control signal provided by the processing circuit.

2. The OVJP apparatus of claim 1, wherein the stage position adjustor moves the OVJP print head relative to the substrate.

3. The OVJP apparatus of claim 1, wherein the stage position adjustor moves the substrate relative to the OVJP print head.

4. The OVJP apparatus of claim 1, wherein the first capacitive sensor comprises:
a first comb comprising a first plurality of conductive electrodes connected to a first common bus.

5. The OVJP apparatus of claim 4, wherein the first capacitive sensor further comprises:
a second comb comprising a second plurality of conductive electrodes connected to a second common bus, wherein the second plurality of electrodes is interdigitated with the first plurality of electrodes.

6. The OVJP apparatus of claim 5, further comprising one or more current sources in electrical communication with the first comb and the second comb and configured to provide an excitation signal to each of the first and second combs, and wherein the excitation signals provided to the first and second combs is in phase.

7. The OVJP apparatus of claim 1, wherein the second capacitive sensor comprises:
a first comb comprising a first plurality of conductive electrodes connected to a first common bus.

8. The OVJP apparatus of claim 7, wherein the second capacitive sensor further comprises:
a second comb comprising a second plurality of conductive electrodes connected to a second common bus, wherein the second plurality of electrodes is interdigitated with the first plurality of electrodes.

9. The OVJP apparatus of claim 7, wherein the second capacitive sensor further comprises a second comb comprising a second plurality of conductive electrodes connected to a second common bus, wherein the second capacitive sensor is disposed within a length of one comb of the first capacitive sensor and offset laterally relative to the first capacitive sensor such that the first and second combs would form an interdigitated structure if placed in alignment.

10. The OVJP apparatus of claim 1, wherein the OVJP print head is positioned between the first capacitive sensor and the second capacitive sensor.

11. The OVJP apparatus of claim 10, wherein the first capacitive sensor is positioned ahead of the OVJP print head relative to a printing direction of motion of the OVJP print head across the substrate.

12. The OVJP apparatus of claim 1, wherein the processing circuit operates the stage position adjustor to maintain the OVJP print head in alignment with a trace disposed on the substrate while the OVJP print head is operated to deposit a material on the substrate.

13. The OVJP apparatus of claim 1, wherein the processing circuit provides a real-time closed-loop feedback system to maintain the OVJP print head in alignment with a trace disposed on the substrate.

14. The OVJP apparatus of claim 1, further comprising a first electrode disposed in a plane with the first and/or second capacitive sensors, wherein the stage position adjustor is further configured to adjust the relative separation between the OVJP print head and the substrate based upon a measured capacitance of the first electrode.

* * * * *